United States Patent
Lim et al.

(10) Patent No.: US 6,866,721 B2
(45) Date of Patent: Mar. 15, 2005

(54) APPARATUS AND METHOD FOR PHOTO-INDUCED PROCESS

(75) Inventors: Keong-Su Lim, Daejeon (KR); Sang-Su Kim, Daejeon (KR)

(73) Assignee: Korea Advanced Institute of Science and Technology, Daejean (KR)

( * ) Notice: Subject to any disclaimer, the term of this patent is extended or adjusted under 35 U.S.C. 154(b) by 104 days.

(21) Appl. No.: 10/113,750

(22) Filed: Apr. 1, 2002

(65) Prior Publication Data

US 2003/0047133 A1 Mar. 13, 2003

(30) Foreign Application Priority Data

Sep. 11, 2001 (KR) ........................................ 2001-55831

(51) Int. Cl.⁷ ............................ C23C 16/00; H05H 1/00
(52) U.S. Cl. ...................... 118/722; 118/620; 118/641; 156/345.5
(58) Field of Search ................................. 118/722, 620, 118/641, 718, 728, 729, 724; 156/345.5, 345.51, 345.52

(56) References Cited

U.S. PATENT DOCUMENTS

| | | | | |
|---|---|---|---|---|
| 4,265,932 A | * | 5/1981 | Peters et al. ................ | 427/582 |
| 4,654,226 A | * | 3/1987 | Jackson et al. ............. | 427/582 |
| 4,836,140 A | * | 6/1989 | Koji ........................... | 118/722 |
| 5,681,394 A | * | 10/1997 | Suzuki .................... | 118/723 R |
| 5,810,930 A | * | 9/1998 | Eom et al. .................. | 118/719 |
| 6,414,280 B1 | * | 7/2002 | Nishitani et al. ........... | 219/411 |

FOREIGN PATENT DOCUMENTS

| JP | 61131418 A | * | 6/1986 | ......... H01L/21/205 |
|---|---|---|---|---|
| JP | 62266822 A | * | 11/1987 | ......... H01L/21/205 |
| JP | 03104869 A | * | 5/1991 | ........... C23C/16/48 |

* cited by examiner

*Primary Examiner*—Parviz Hassanzadeh

(57) ABSTRACT

Apparatus for a photo-induced process are provided, which implement a transparent film (instead of an optical window), to reduce light absorption loss that would result from use of an optical window. A photo-induced process apparatus eliminates problems of conventional systems which use optical windows, such as blurring an optical window and the surface of a light source, photo absorption loss due to the optical window and/or a purge cleaning gas, and dust generation by a moving part such as a flexible curtain. A photo-induced process apparatus efficiently utilizes light emitted from a light source.

20 Claims, 5 Drawing Sheets

APPARATUS AND METHOD FOR PHOTO-INDUCED PROCESS

BACKGROUND OF THE INVENTION

1. Field of the Invention

The present invention relates to an apparatus and method for solving blur problems on the surfaces of a light source and an optical window in a photo-induced process, and more particularly, to an apparatus and method for preventing a material produced by decomposition of a reaction gas at the time of deposition of a material by using a photo-induced process, that is, a photochemical vapor deposition (photo-CVD) or a material produced by photo-induced oxidation of a sample, etching, ashing, or the like from being attached to the surface of the light source or the optical window, in a reaction chamber of the photo-induced process apparatus.

2. Description of the Related Art

There is deposition of a material on a substrate, oxidation of a sample, etching, ashing, annealing, surface modification and cleaning, as a photo-induced process. A photo-CVD will be described below as a representative example.

FIGS. 1 and 2 show a conventional photo-CVD apparatus, respectively.

The FIG. 1 technology is disclosed in U.S. Pat. No. 4,654,226. Based on the FIG. 1 technology, a conventional technology preventing a blur phenomenon on an optical window will be described. Referring to FIG. 1, light beams B emitted from a plurality of light sources 100 provided in the atmosphere at the outside of a reaction chamber S pass through an optical window 110 and then are irradiated into the reaction chamber S. Here, if a reaction gas is made to flow into the reaction chamber S in the direction of an arrow mark (←), the reaction gas is decomposed by the irradiated light and thus a thin film is formed on the substrate 120 by using a chemical vapor reaction by a photo-induced process. Meanwhile, a flexible curtain 130 is installed between a substrate 120 and the optical window 110. The flexible curtain 130 is continuously fed at a constant speed at the state where the flexible curtain 130 has been wound up around a lefthand roller in a roll form, and wound around a righthand roller. Here, since the flexible curtain 130 closely contacts the uppermost edge portion of the wall surface in a reaction room which is vertically placed, the reaction gas in the reaction chamber S is not made to reach the optical window 110. However, a sealing between the uppermost edge portion of the vertical wall surface in the reaction room and the flexible curtain 130 is not perfect, the reaction gas leaks from a gap therebetween to cause the optical window 110 to be blurred. Thus, in the FIG. 1 apparatus, a cleaning gas for an optical window purge is made to flow between the flexible curtain 130 and the optical window 110 in the direction of an arrow mark (→), to thereby prevent a blurring phenomenon of the optical window 110.

FIG. 2 is a conceptual view for explaining a process for replacing an optical window blurred in another conventional photo-CVD apparatus, which is disclosed in U.S. Pat. No. 5,810,930. Further, a method for replacing a blurred optical window with a cleaned optical window without breaking a vacuum by using an optical window replacement apparatus, and a method for forming a thin film on a large-area substrate by using a photo-CVD apparatus equipped with an optical window replacement apparatus are also described in the U.S. Pat. No. 5,810,930. The operation of the optical window replacement apparatus will be described below referring to FIG. 2.

When a photo-CVD process is completed at the state where the optical window 200 closely contacts the edge of an upper optical hole in the reaction chamber 210 by a mechanical compression force, an optical window which is blurred by attachment of a reaction product and a reaction gas is transferred to an optical window replacement chamber 220 by means of a mechanical driving apparatus. Then, a gate valve 230 is closed and a nitrogen gas or an inert gas (N) inserted through a first inlet 222, to make the internal pressure become the state of the atmosphere. Then, a cover 240 is opened to replace the blurred optical window with a cleaned optical window 250 and then is closed. Then, the internal gas is discharged through an outlet 224 so that the optical window replacement chamber 220 becomes a high vacuum state, and then the gate valve 230 is re-opened to then transfer the cleaned optical window 250 to an optical window fixing chamber 260. Thereafter, the optical window is made to closely contact a predetermined position, that is, the circumference of the upper optical hole of the reaction chamber 210. When a process of forming a thin film on the substrate 270 with the photo-CVD apparatus is performed, a reaction gas is made to flow into the reaction chamber 210 through a reaction gas feed tube 216 and a nitrogen gas or an inert gas is made to flow into the fixing chamber 260 through an inlet 226, as much as a desired amount of flow. Then, light is irradiated from a light source 280 at the state where the two chambers 210 and 260 have no pressure difference. The gas in the two chambers 210 and 260 is discharged through outlets 218 and 228, respectively. By the above-described method, since the optical window is replaced at the state where the optical window fixing chamber 260 and the reaction chamber 210 are completely isolated from the optical window replacement chamber 220 by the gate valve 230, the reaction chamber 210 is not exposed to the atmosphere semi-permanently. Thus, since the inside of the reaction chamber 210 is not polluted by oxygen, nitrogen, dust or the like in the air, a high-quality thin film can be formed. Also, since there is no friction between the thin film attached optical window surface and the other portions during detachment and movement of the optical window, dust may not be generated to thus maintain the reaction chamber to be in the clean state continuously. Also, since the light source can be inserted in a vacuum, and a pressure difference applied to both sides of the optical window is little during formation of the thin film, a thin optical window can be used to thus make a large-area thin film forming apparatus.

As described above, in the FIG. 1 apparatus, the flexible curtain closely contacts the uppermost edge of the vertical wall surface in the reaction chamber and thus a space where a window purge cleaning gas flows between the flexible curtain and the optical window is isolated from the reaction chamber. However, since the sealing is not perfect, a blur phenomenon of the optical window cannot be effectively removed during deposition of a thin film. Also, when the flexible curtain is wound up in order to replace it with a new one during performing a thin film deposition or after completion of the thin film deposition, dust may be generated due to a friction with the uppermost edge of the reaction chamber wall surface closely contacting the flexible curtain. Also, in this apparatus, the optical window should be thick so that it can resist against the atmosphere. In addition, since an optical window purge cleaning gas is made to flow between the optical window and the flexible curtain, light absorption losses in the optical window and the purge cleaning gas cannot be ignored. Since this problem becomes further serious as the apparatus becomes larger, it is not nearly possible to fabricate a large-area apparatus with the structure that a light source is placed in the air and light is irradiated into the reaction chamber through the optical window. Also, a light source for emitting a vacuum ultra-violet light ray cannot be used with the structure that the light source is placed in the air. In order to solve the above-described problem, a structure that a light source is put in a space where an optical window purge cleaning gas flows, is disclosed in U.S. Pat. No. 4,654,226. By doing so, the optical window need not be used and it is possible to fabricate the large-area apparatus and use the vacuum ultra-violet light source. However, even in the structure of the light source placed in the vacuum, the surface of the light source cannot be prevented from being blurred by the material produced by the photo-chemical reaction due to the imperfect sealing between the reaction chamber and the flexible curtain as described above.

Meanwhile, according to the FIG. 2 apparatus, a large-area thin film can be deposited. However, since a large-area optical window should be used as well in this case, the large-area thin optical window may be damaged during cleaning the large-area optical window physically, and it is also difficult to handle the large-area thin optical window. Thus, the optical window should be thick to a degree. Accordingly, the light absorption loss in the optical window cannot but increase. Also, a vacuum should be broken in an optical window replacement chamber every time when the optical window need to be replaced and the polluted optical window should be replaced with a cleaned optical window. Then, the optical window replacement chamber is discharged to be a high vacuum state. As a result, the working ratio of the apparatus becomes low.

SUMMARY OF THE INVENTION

To solve the above problems, it is an object of the present invention to provide a photo-induced process apparatus for removing a blurring problem of an optical window and the surface of a light source, a photo absorption loss problem in the optical window and by a purge cleaning gas, and a dust generation problem by a moving part such as a flexible curtain, and utilizing the light emitted from the light source efficiently.

It is another object of the present invention to provide a method for performing a photo-induced process using the above-described photo-induced process apparatus.

To accomplish the above object of the present invention, there is provided a photo-induced process apparatus comprising: a reaction chamber housing having an opening on the central portion of an upper plate through which light is transmitted, and a support for supporting a sample or a substrate; a light source whose light emission plane faces the opening so that the light is irradiated into the reaction chamber through the opening; a transparent film installation and storage chamber housing located between the light emission plane of the light source and the reaction chamber opening, having an opening through which light is transmitted from the light source to the reaction chamber on the central portion of the upper plate and a lower plate, in which the lower plate is combined with the reaction chamber upper plate; a transparent film located horizontally in the transparent film installation and storage chamber housing, the transparent film transmitting the light from the light source; a first flange in which the light emission plane edge of the light source is welded along the circumference of the central opening; a second flange which is welded along the circumference of the installation and storage upper plate opening; an extension and contraction portion in which third flanges having the respective same size as those of the first and second flanges are welded on both ends thereof so that the first and second flanges are connected to the third flanges respectively in a manner of connecting the same sized flanges, to thereby make the light source, the transparent film installation and storage chamber housing, the reaction chamber housing in a single sealing space, and enable the light source to move up and down without breaking the vacuum; and a driving unit for moving the light source up and down.

BRIEF DESCRIPTION OF THE DRAWINGS

The above object and other advantages of the present invention will become more apparent by describing the preferred embodiments thereof in more detail with reference to the accompanying drawings in which.

DETAILED DESCRIPTION OF THE INVENTION

Preferred embodiments of the present invention will be described with reference to the accompanying drawings.

Figure 1:
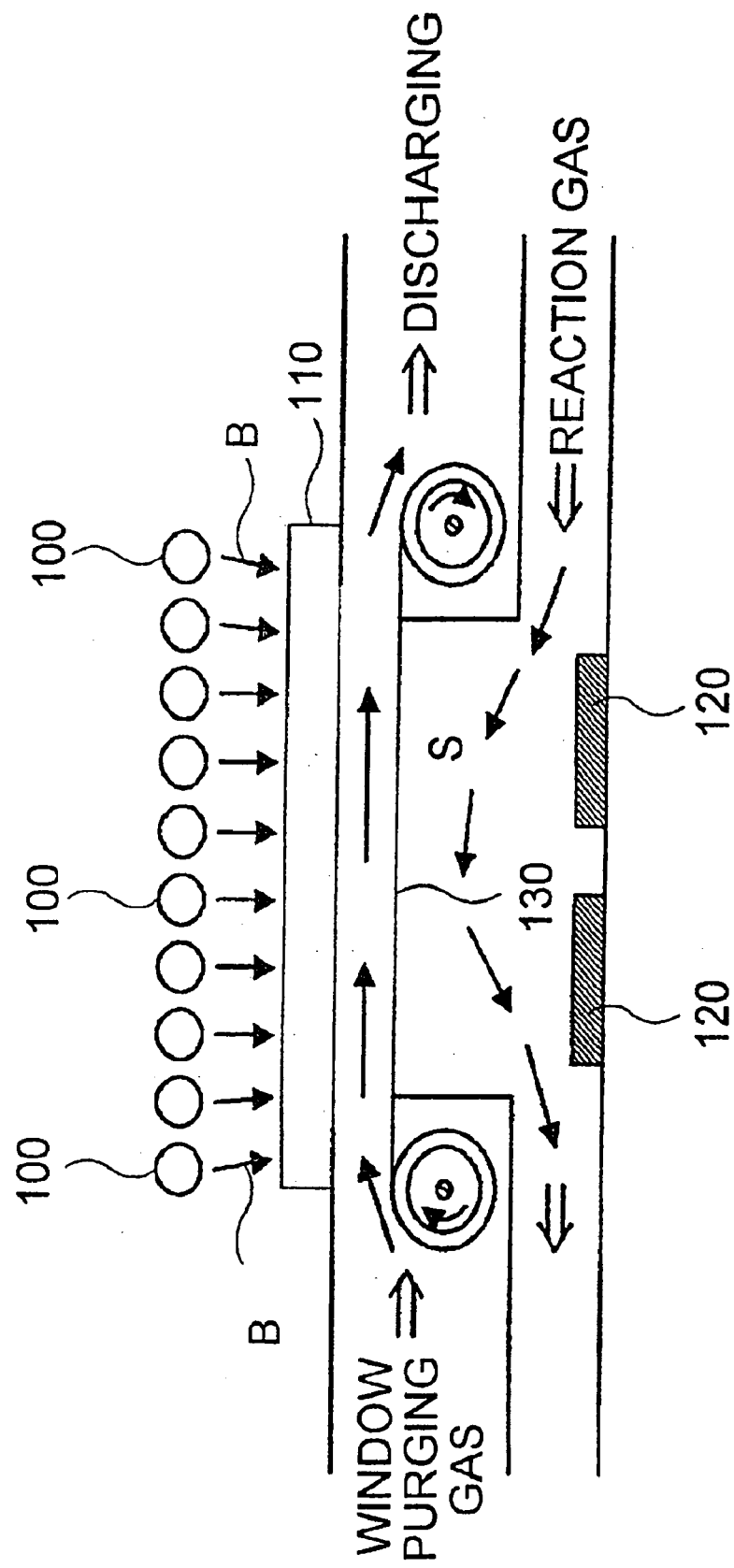
FIG. 1 is a schematic view showing a conventional photo-chemical vapor deposition (photo-CVD) apparatus using a flexible curtain in order to prevent a blurring phenomenon on an optical window.
Figure 2:
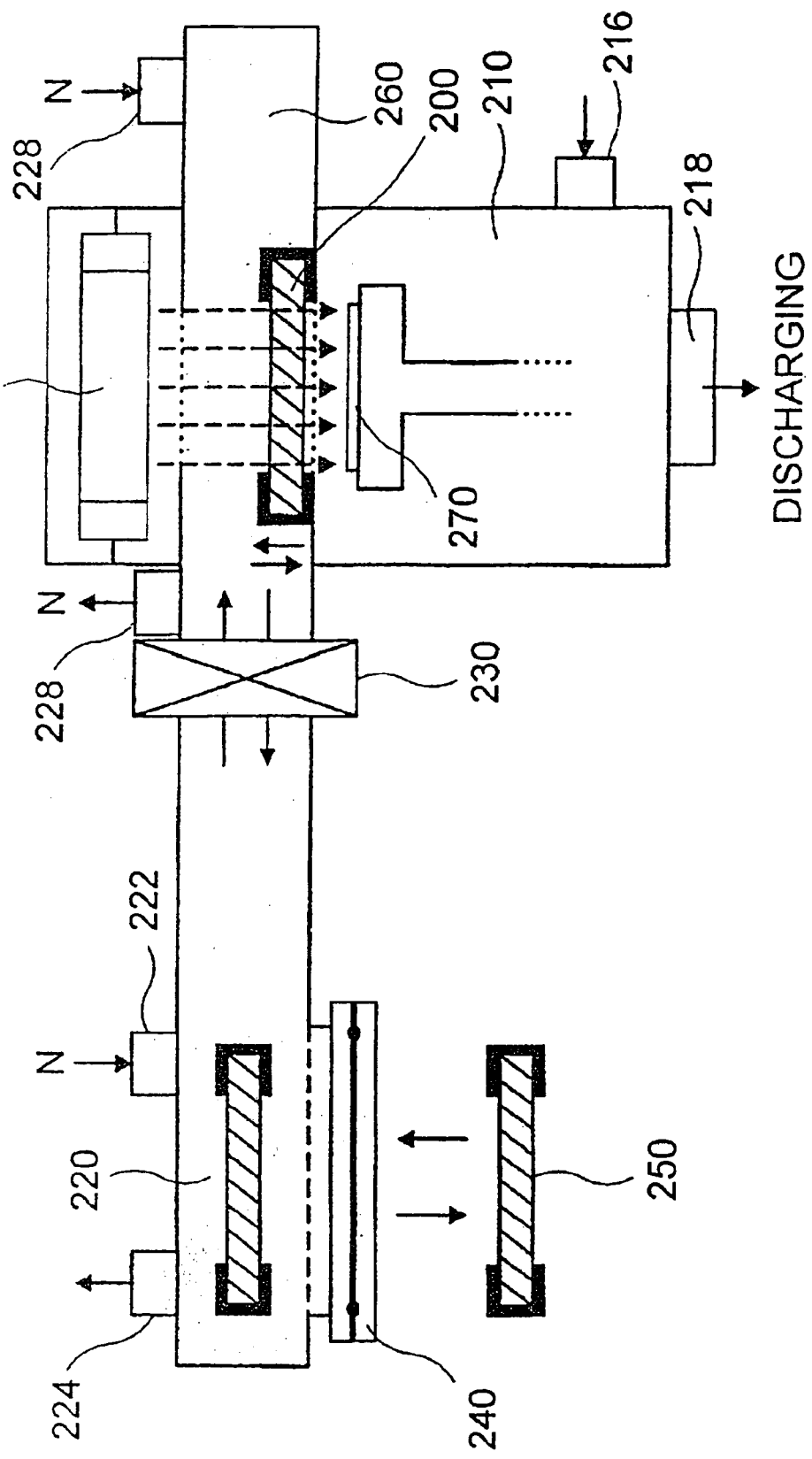
FIG. 2 is a schematic view for explaining a process of replacing a blurred optical window in another conventional photo-CVD apparatus.
Figure 3:
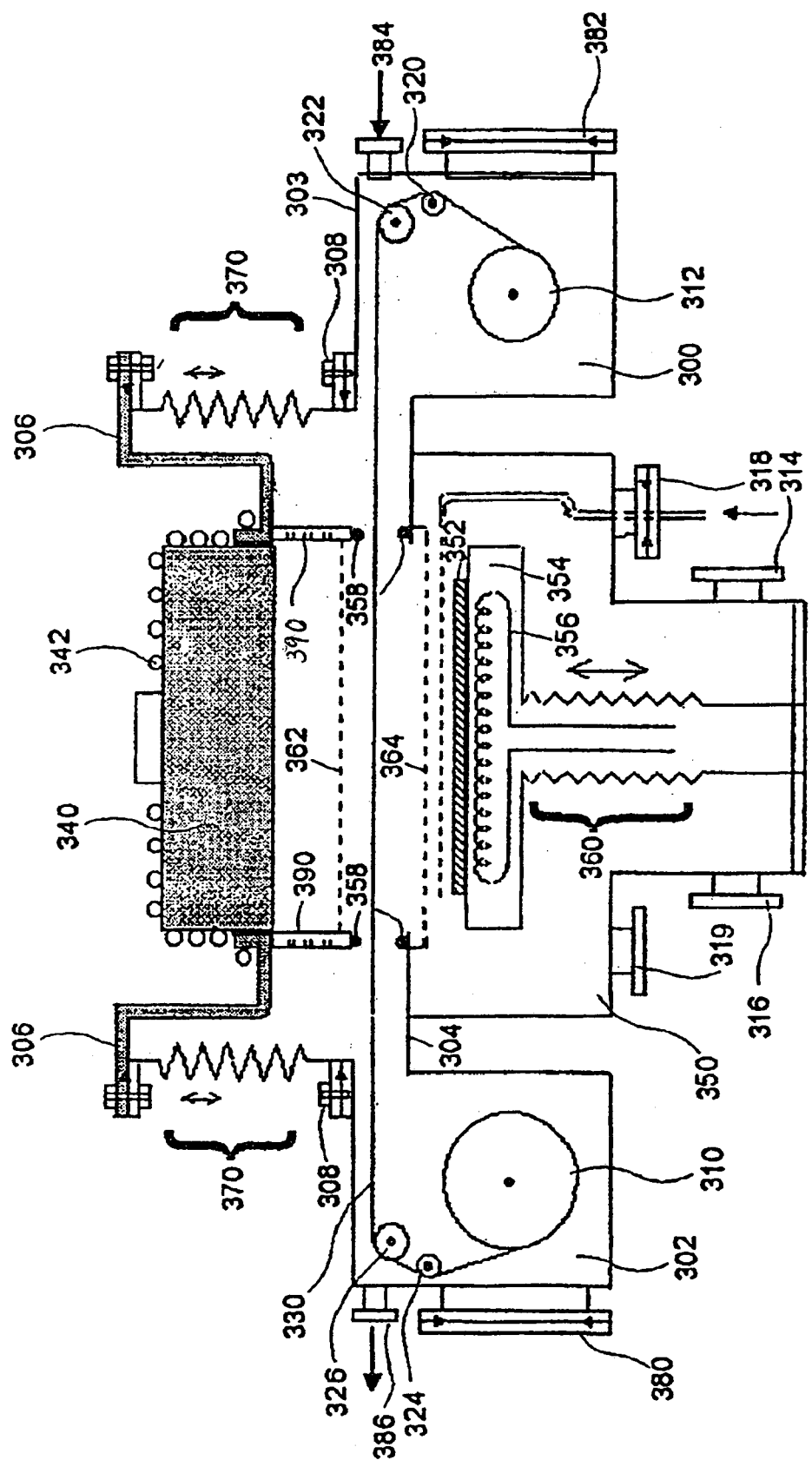
FIG. 3 is a schematic view showing a photo-induced process apparatus according to the present invention.

Referring to FIG. 3, a photo-induced process apparatus according to the present invention does not use an existing optical window such as a quartz window having a high transitivity of an ultra-violet light ray region. The photo-induced process apparatus according to the present invention has a structure that the light emission plane of a light source 340 faces an opening for transmitting light in the upper portion of a reaction chamber 350, in which a thermal-resistant transparent film 330 is horizontally installed in a space between the light emission plane of the light source 340 and the upper portion of the reaction chamber 350, to thereby prevent a blur on the surface of the light source. A transparent film installation and storage chamber is connected to the upper portion of the reaction chamber 350. The transparent film installation and storage chamber has an opening on the central portions of an upper plate 303 and a lower plate 304, respectively. A feeding chamber 302 and a winding chamber 300 for separately storing two roles of transparent films 310 and 312 are provided in the left and right sides of the installation and storage chamber, respectively. A clean transparent film 330 of several tens micron ($\mu$m) thick wound around the transparent film role 310 in the lefthand feeding chamber 302 passes through lefthand and righthand rollers 324, 326, 322 and 320 in turn, and then wound around the transparent film role 312 in the righthand winding chamber 300. Meanwhile, the central axis of an opening provided in the central portion of the upper plate 303 and the lower plate 304 in the installation and storage chamber housing coincides with that of the light emission plane of the light source 340 and the reaction chamber 350. Also, the lower plate 304 in the transparent film installation and storage chamber housing is combined with the upper plate of the reaction chamber 350 in which an opening is formed, by a welding, an O-ring, a gasket or the like. In order to seal the upper plate opening in the transparent film installation and storage chamber and the light emission plane of the light source 340, the light emission plane edge of the light source 340 is welded to the central opening circumference of a first flange 306. Here, the surface of the light emission plane of the light source 340 and the lower plane of the first flange 306 are made to be placed on the same plane. In other words, the light emission plane of the light source 340 makes level with the lower plane of the first flange 306, and then the first flange 306 is welded. The first flange 306 is made of stainless steel or any materials capable of welding with a material of the light emission plane. Also, in the case that the light source 340 may be damaged as the light source 340 is beyond endurance to the atmosphere, a part of or the whole remaining outer surface of the light source 340 except for the light emission plane of the light source 340 exposed to the installation and storage chamber opening is welded with a reinforced material so that the light source 340 can be endured to the atmosphere.

The reinforced material is stainless steel or a material which can be welded to the material of the surface of the light source. Then, a second flange 308 is welded along the circumference of the installation and storage chamber opening. The photo-induced process apparatus according to the present invention includes an extension and contraction portion 370 made of a formed bellows or a welded bellows having third flanges of the same sizes as those of the first and second flanges on either end thereof, in order to connect the third flanges with the first flange 306 and the second flange 308, respectively. By using the extension and contraction portion 370, the light source having the first flange is connected to the installation and storage chamber upper plate opening having the second flange.

As a result, the flanges 306 to which the light source 340 is attached, the extension and contraction portion 370, the transparent film installation and storage chamber housing, and the reaction chamber housing are combined in turn to form a single sealing space. During the photo-induced process, the temperature of the surface of the light source can rise up to approximately 400° C. as being the case. Accordingly, if a polymer group material is used as a transparent film, the transparent film is melted and torn or deformed and damaged. In the case that the transparent film is torn due to the high temperature of the light source surface, the reaction gas flows into the installation and storage chamber so that a thin film is deposited on the light source surface. Accordingly, an original purpose of using the transparent film is meaningless. Also, when the transparent film is deformed, the vacuum ultra-violet light ray generated from the light source is not irradiated into the reaction chamber uniformly. Accordingly, a uniformity of the thin film to be deposited through the reaction in the reaction chamber is lowered and thus it is impossible to obtain a deposition which can be regenerated. In order that the high temperature of the light source surface does not influence upon the transparent film, a cylinder 390 of a metal or ceramic material for preventing the direct contact of the light source and the transparent film is vertically inserted into the central opening circumferential portion of the first flange. The inserted cylinder 390 mates with the central opening circumferential portion of the first flange through a welding work, or may be detachably inserted by using a connection groove formed on the central opening circumferential portion of the first flange. However, a connection ring to be fitted into the connection groove is needed on the upper end of the cylinder. A number of small holes are formed on the inserted cylinder within the limit that the structure is not deformed so that gas can be smoothly passed. A groove is formed on the lower end circumferential portion of the cylinder to insert an O-ring therein to in order to maintain a sealing without damaging the transparent film, when the cylinder contacts the transparent film.

Figure 4:
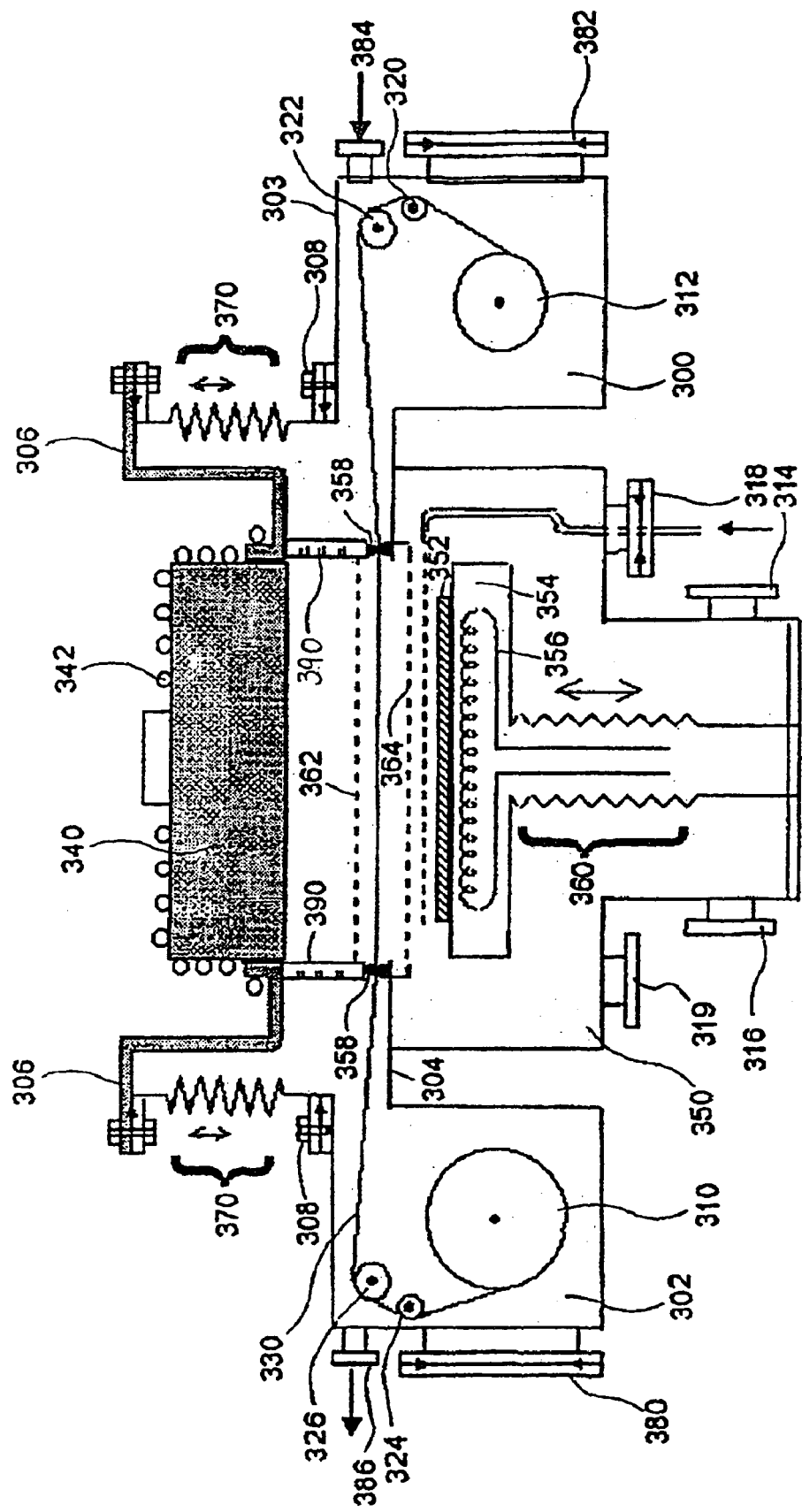
FIG. 4 is a schematic view for explaining a process of performing a deposition process in the photo-induced process apparatus shown in FIG. 3.

As shown in FIG. 4, in order to form a thin film, the light source 340 is made to lag downwards vertically, in which the lower end portion of the cylinder 390 connected to the central opening circumference of the first flange 306 by means of a welding work or a detachable mariner while pushing down the transparent film 330 is fitted with the transparent film 330 and slightly closely contacts the O-ring 358. Here, the extension and contraction portion 370 using the formed bellows or welded bellows is contracted to thus accomplish the objective without destruction of the vacuum in the reaction chamber. In this state, the reaction gas is filled in the reaction chamber 350 through the first inlet 318. Then, the reaction gas is discharged through a first outlet 319 so that the pressure in the reaction chamber becomes a predetermined pressure, and the light from the light source 340 is irradiated to thereby form a thin film. Here, a nitrogen gas or an inert gas is made to flow through a third inlet 384 and to discharge through a third outlet 386 so that the pressure of the transparent film installation and storage chamber 302 and the winding chamber 300, that is, the pressure of the installation and storage chamber is slightly higher than or equal to the reaction chamber 350. By doing so, the reaction gas in the reaction chamber 350 is prevented from being leaked into the installation and storage chamber via the O-ring 358 at maximum, and the damage of the transparent film is prevented due to the pressure difference in the two upper and lower space isolated by the transparent film. In the apparatus for forming a large-area thin film, the transparent film lags downwards or swells upwards due to the pressure difference between the upper and lower portions of the transparent film. Support nets 362 and 364 which are weaved roughly with a minute line of the transparent thermal-resistant material or metal material are installed in one or both sides of the upper and lower of the transparent film, to thereby prevent the transparent film from lagging downwards or swelling upwards. In this case, the support nets 362 and 364 should use sufficiently thin and roughly weaved nets so that an absorption loss of light emitted from the light source is minimized, and be also designed to have as many intensities as downward lagging or upward swelling of the transparent film due to the pressure difference between the upper and lower portions of the transparent film can be physically supported. Here, the support nets 362 and 364 are installed in both or one of the reaction chamber 350 and the transparent film installation and storage chamber so that it can be detached according to the purpose of the photo-induced process apparatus. It is preferable that the support nets are installed above the transparent film, that is, in the installation and storage chamber rather than in the reaction chamber during performing a photo-CVD, since dust can be suppressed. In this case, the pressure of the installation and storage chamber need to be set slightly lower than the pressure of the reaction chamber. Also, at the time of the photo-induced process which does not blur the surface of the light source, the transparent film should not be necessarily used. A heater 356 for adjusting the temperature of a substrate 352 is internally installed in the substrate heating support 354 supporting the substrate 352. The position of the substrate 352 is adjusted by the up and down movement of the substrate heating support 354 in the reaction chamber so that a deposition process can be performed at an optimal condition. A driving device (not shown) for the up and down movement of the substrate heating support 354 is installed in the outside of the reaction chamber 350. An extension and contraction portion 360 formed of a bellows for the up and down movement of the substrate heating support is provided so that the vacuum in the reaction chamber 350 is not destructed at the time of the up and down movement of the substrate heating support 354. Thus, the extension and contraction portion 360 can extend or contract.

Meanwhile, when a thin film is completely formed, a supply of a nitrogen gas or inert gas and a reaction gas is stopped, and then these gases are discharged through the first and third outlets 319 and 386. For the purpose of cleaning the reaction chamber, a nitrogen gas or inert gas is supplied to the reaction chamber through the second inlet 314, and then a process of discharging the supplied gas through the second outlet 316, that is, a purging is repeated three or four times. Then, the reaction chamber is discharged through the first outlet 319 to a high vacuum degree. When a purging is performed or a high vacuum discharging is performed in the reaction chamber so that the pressure difference between both sides of the transparent film does not occur in the above-described processes, an inert gas is made to flow into and a high vacuum discharging is made to the transparent film installation and storage chamber. Then, if the light source 340 is raised up vertically to an original position, the transparent film is supported by the rollers 324, 326, 322 and 320, and becomes again the state as shown in FIG. 3. Then, a portion which is blurred by attachment of the film is replaced with a new clean transparent film by winding up the righthand role 312. In this way, formation of the thin film and replacement of the transparent film are performed alternately. Thus, the reaction chamber 350 can be maintained at a high purity constantly without being exposed to the atmosphere, until a clean film in the feeding chamber 302 is consumed out, to thereby form a high-quality thin film. Here, for the needed photo-induced process, the substrate 352 should be installed on the substrate heating support 354 in the reaction chamber 350, and then a load-lock chamber (not shown) and a substrate transfer mechanism (not shown) should be provided in order to avoid the vacuum in the reaction chamber 350 from being destructed when the substrate 354 is taken out from the reaction chamber 350 after the process has been completed. Also, a gate valve (not shown) is installed between the reaction chamber 350 and the load-lock chamber. The gate valve should be always closed in the case other than a substrate transferring process for installation and collection of the substrate 352, to thereby isolate the reaction chamber 350 and the load-lock chamber (not shown). In the case that the transparent film is consumed out in the feeding chamber, the completely consumed film role 312 is taken out by opening the second opening 382 in the winding chamber 300. After opening the first opening 380 in the feeding chamber 302, a clean transparent film role is mounted to load the transparent film as shown in FIG. 3. Then, the openings 380 and 382 are closed, to then discharge the feeding chamber 302, the winding chamber 300 and the reaction chamber 350 to a high vacuum degree simultaneously. In this case, a purging need to be performed three or four times by using a purge cleaning gas. In the present invention, no optical window is used. Thus, the light emitted from the light source can be used very effectively.

Figure 5:
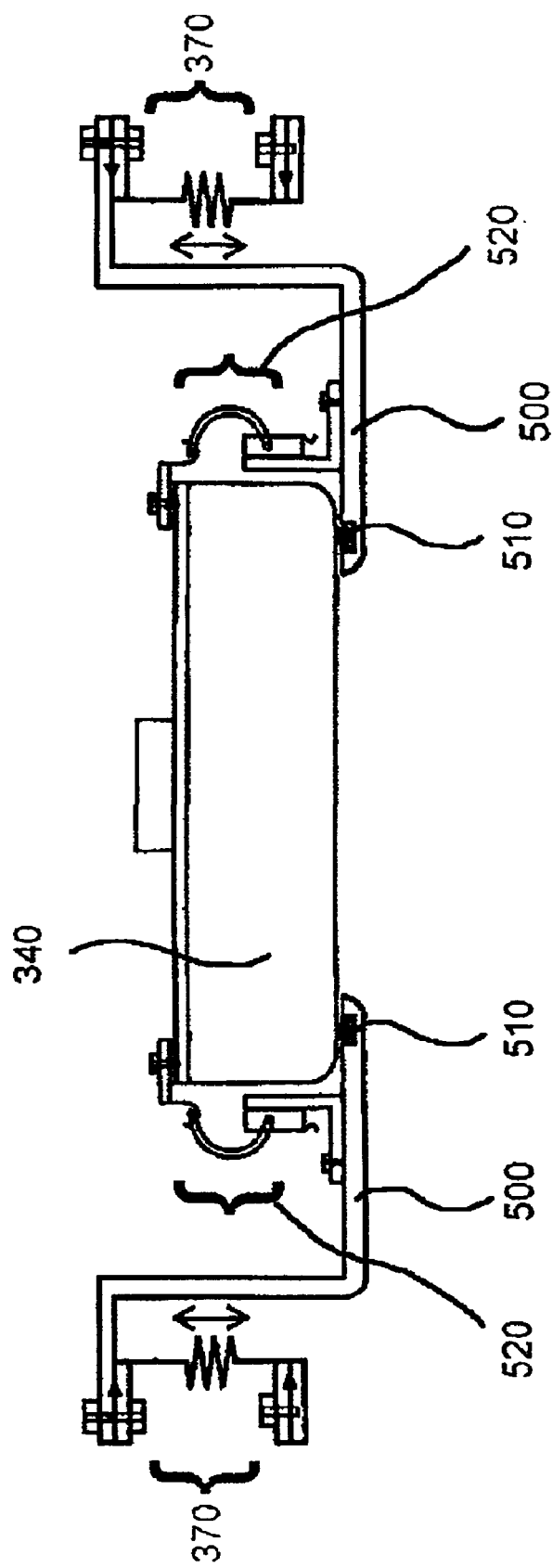
FIG. 5 is a schematic sectional view for explaining another method process of connecting the light source and the flange in a photo-induced process apparatus according to another embodiment of the present invention.

Also, when a thin film is formed as shown in FIG. 4, while the light source 340 assumes the function of part of the upper plate in the photo-CVD apparatus, that is, the function o fresisting against the atmosphere, the inside of the reaction chamber of the vacuum state faces the light emission plane in which the transparent film 330 is interposed between the former and the latter. Accordingly, the light source emitting the light of the vacuum ultra-violet light ray region can be used. In this case, a transparent film 330 having a high light transitivity of the vacuum ultra-violet light ray region should be used. Also, it is preferable that part of or the whole outer surface of the light source except for the light emission plane is wrapped with a stiff material such as stainless steel so that the light source can be endured to the atmosphere. A water cooler tube 342 is provided along the circumference of the light source 340 in order to prevent the light source from being overheated. An air cooler electric fan may be used other than the water cooler tube 342. In the case that a large-area light source such as an excimer lamp is used as the light source 340, it is possible to make a photo-CVD apparatus capable of making a large-area substrate. Also, other than the excimer lamp, a light source which emits light of vacuum ultra-violet light ray region or ultra-violet light ray region such as a heavy hydrogen discharging tube, a Xenon (Xe) lamp, a low-pressure mercury lamp or the like is used, the short-wavelength light of the region can be easily used. As described above, a method of welding a flange 306 of the material such as stainless steel to the edge of the light emission plane of the light source 340 can be used as a method of connecting the light source 340 to an extension and contraction portion 370 while securing a sealing of the reaction chamber 350. However, in order to mitigate inconveniences of welding a light source to a flange during replacement of the light source or manufacturing of the light source, a light source 340 and a flange 500 are connected to a hinge 520 and an O-ring 510 is used, to thereby maintain a sealing in the reaction chamber as shown in FIG. 5.

As described above, the present invention can realize a photo-induced process apparatus which can efficiently utilize light emitted from a light source, in particular, vacuum ultra-violet light, and remarkably enhance a working efficiency in comparison with an existing apparatus. Also, the photo-induced process apparatus according to the present invention is very simple and practical, to thereby easily perform a photo-induced process with respect to a large-area substrate.

The present invention is not limited to the above-described embodiments. It is apparent to one who has an ordinary skill in the art that there may be many modifications and variations within the same technical spirit of the invention.

What is claimed is:

1. A photo-induced process apparatus comprising:
   a reaction chamber housing comprising an upper plate including a first opening through which light is transmitted, and a support for supporting a sample or a substrate;
   a light source comprising a light emission plane that faces the first opening so that the light is irradiated into the reaction chamber through the first opening;
   a transparent film installation and storage chamber housing disposed between the light emission plane of the light source and the reaction chamber the transparent film installation and storage chamber housing comprising a lower plate and an upper plate, wherein the lower plate includes a second opening and the upper plate includes a third opening and wherein the lower plate of the transparent film installation and storage chamber housing is connected to the upper plate of the reaction chamber such that the first opening and second opening are aligned;

a transparent film installed in the transparent film installation and storage chamber housing to prevent blurring of a light emission surface of the light source;

a first flange having a fourth opening wherein an edge of the light emission plane of the light source is attached to the first flange along a perimeter of the fourth opening;

a second flange which is connected along a perimeter of the third opening of the upper plate of the installation and storage chamber housing;

an extension and contraction portion comprising upper and lower third flanges connected to end portions of the extension and contraction portion, wherein the upper third flange is connected to the first flange and wherein the lower third flange is connected to the second flange, wherein the reaction chamber housing, the transparent film installation and storage chamber housing, the extension and contraction portion, and the first flange with the light source, connected together form a single sealed space that can maintain a vacuum, and enable the light source to move up and down without breaking the vacuum; and a driving unit for moving the light source up and down.

2. The photo-induced process apparatus of claim 1, further comprising a cylinder fixedly or detachably attached along the perimeter of the fourth opening of the first flange, wherein the cylinder prevents direct contact between the light source and the transparent film, and wherein the cylinder comprises a plurality of holes formed therein to allow circulation of a cleaning gas.

3. The photo-induced process apparatus of claim 2, wherein said cylinder is made of a ceramic or metal material.

4. The photo-induced process apparatus of claim 1, further comprising an O-ring attached along the perimeter of the first opening in said reaction chamber housing to provide a point of contact of the transparent film.

5. The photo-induced process apparatus of claim 1, wherein the support installed in said reaction chamber housing comprises:

a heater installed in the support, for raising or adjusting the temperature of the sample or the substrate; and a second extension and contraction portion for enabling an up and down movement of the support.

6. The photo-induced process apparatus of claim 1, wherein said light source is at least one selected from the group consisting of an ultra-violet light ray emission light source group, a visible light ray light source group and an infra-red light ray light source group, comprised of an excimer lamp, a heavy hydrogen discharging tube, a Xenon lamp, and a low pressure mercury lamp.

7. The photo-induced process apparatus of claim 6, further comprising a cooling device for cooling the light source, wherein the cooling device includes a fan or a water cooler tube attached to an external wall other than the light emission plane of the light source.

8. The photo-induced process apparatus of claim 1, further comprising one or more support nets installed in at least one of the reaction chamber housing and the transparent film installation storage chamber housing, wherein said one or more support nets support the transparent film to prevent the transparent film from lagging or swelling due to the pressure difference between the upper and lower portions of the transparent film, and are roughly weaved in finite lines made of a transparent thermal-resistant material or metal material which can be used in a vacuum.

9. The photo-induced process apparatus of claim 1, wherein said reaction chamber housing comprises:

a first inlet through which a reaction gas is supplied into the reaction chamber;

a first outlet through the reaction gas is discharged;

a second inlet through a cleaning purge gas is supplied into the reaction chamber; and a second outlet through which the purge gas is discharged.

10. The photo-induced process apparatus of claim 1, wherein said transparent film installation and storage chamber housing comprises:

a third inlet through which a nitrogen gas or inert gas is supplied into the transparent film installation and storage chamber housing;

a first opening through which the gas in the transparent film installation and storage chamber housing is discharged; and a second opening through which transparent film is detached and collected.

11. The photo-induced process apparatus of claim 1, wherein said extension and contraction portion is made of a formed bellows or welded bellows.

12. A photo-induced process apparatus comprising:

a reaction chamber housing comprising an upper plate including a first opening through which light is transmitted, and a support for supporting a sample or a substrate;

a light source comprising a light emission plane that faces the first opening so that the light is irradiated into the reaction chamber through the first opening;

a transparent film installation and storage chamber housing disposed between the light emission plane of the light source and the reaction chamber the transparent film installation and storage chamber housing comprising a lower plate and an upper plate, wherein the lower plate includes a second opening and the upper plate includes a third opening, and wherein the lower plate of the transparent film installation and storage chamber housing is connected to the upper plate of the reaction chamber such that the first opening and second opening are aligned;

a transparent film installed in the transparent film installation and storage chamber housing to prevent blurring of a light emission surface of the light source;

one or more support nets installed in at least one of the reaction chamber housing and the transparent film installation and storage chamber housing, to provide support to the transparent film;

a first flange to which the light source is detachably connected;

a combining unit for combining the light source and the first flange;

a second flange which is connected along a perimeter of the third opening of the upper plate of the transparent film installation and storage chamber housing;

an O-ring which is positioned at a contact portion of the light source and the first flange to provide a seal between the light source and the first flange;

an extension and contraction portion comprising upper and lower third flanges connected to end portions of the extension and contraction portion, wherein the upper third flange is connected to the first flange and wherein the lower third flange is connected to the second flange, wherein the reaction chamber housing, the transparent film installation and storage chamber housing, the extension and contraction portion, and the first flange with the light source, connected together form a single sealed space that can maintain a vacuum, up and down without breaking the vacuum; and a driving unit for moving the light source up and down.

13. The photo-induced process apparatus of claim 12, wherein the first opening in said reaction chamber housing comprises a second O-ring attached along the perimeter of the first opening to provide a point of contact of the transparent film.

14. The photo-induced process apparatus of claim 12, wherein the support installed in said reaction chamber housing comprises:

a heater installed in the support, for raising or adjusting the temperature of the sample or the substrate; and a second extension and contraction portion for enabling an up and down movement of the support.

15. The photo-induced process apparatus of claim 12, wherein said light source is at least one selected from the group consisting of an ultra-violet light ray emission light source group, a visible light ray light source group and an infra-red light ray light source group, comprised of an excimer lamp, a heavy hydrogen discharging tube, a Xenon lamp, and a low pressure mercury lamp.

16. The photo-induced process apparatus of claim 15, further comprising a cooling device for cooling the light source, wherein the cooling device includes a fan or a water cooler tube attached to an external wall other than the light emission plane of the light source.

17. The photo-induced process apparatus of claim 12, wherein said one or more support nets support the transparent film to prevent the transparent film from lagging or swelling due to the pressure difference between the upper and lower portions of the transparent film, and are roughly weaved in finite lines made of a transparent thermal-resistant material or metal material which can be used in a vacuum.

18. The photo-induced process apparatus of claim 12, wherein said reaction chamber housing comprises:

a first inlet through which a reaction gas is supplied into the reaction chamber;

a first outlet through the reaction gas is discharged;

a second inlet through a cleaning purge gas is supplied into the reaction chamber; and a second outlet through which the purge gas is discharged.

19. The photo-induced process apparatus of claim 12, wherein said transparent film installation and storage chamber housing comprises:

a third inlet through which a nitrogen gas or inert gas is supplied into the transparent film installation and storage chamber housing;

a first opening through which the gas in the transparent film installation and storage chamber housing is discharged; and a second opening through which transparent film is detached and collected.

20. The photo-induced process apparatus of claim 12, wherein said extension and contraction portion is made of a formed bellows or welded bellows.

* * * * *